(12) United States Patent
Lin et al.

(10) Patent No.: US 8,373,613 B2
(45) Date of Patent: Feb. 12, 2013

(54) PHOTOVOLTAIC APPARATUS

(75) Inventors: Hung Hsuan Lin, Taipei (TW); Chun Yih Wu, Taichung (TW); Ta Chun Pu, Kaohsiung (TW)

(73) Assignee: Industrial Technology Research Institute, Chutung, Hsinchu (TW)

( * ) Notice: Subject to any disclaimer, the term of this patent is extended or adjusted under 35 U.S.C. 154(b) by 413 days.

(21) Appl. No.: 12/827,502

(22) Filed: Jun. 30, 2010

(65) Prior Publication Data

US 2011/0030757 A1 Feb. 10, 2011

Related U.S. Application Data

(60) Provisional application No. 61/231,233, filed on Aug. 4, 2009.

(51) Int. Cl.
*H01Q 15/02* (2006.01)
(52) U.S. Cl. ....................................... 343/909; 136/244
(58) Field of Classification Search .................. 343/909; 136/244, 256
See application file for complete search history.

(56) References Cited

U.S. PATENT DOCUMENTS

| | | | |
|---|---|---|---|
| 5,327,149 A | 7/1994 | Kuffer | |
| 5,835,058 A | 11/1998 | Upton | |
| 6,087,991 A | 7/2000 | Kustas | |
| 6,150,995 A | 11/2000 | Gilger | |
| 6,395,971 B1 | 5/2002 | Bendel et al. | |
| 6,590,150 B1 | 7/2003 | Kiefer | |
| 6,727,425 B2 * | 4/2004 | Takada et al. | 136/244 |
| 7,102,579 B2 | 9/2006 | Haaft et al. | |
| 7,129,493 B2 | 10/2006 | Garner et al. | |
| 7,671,799 B1 * | 3/2010 | Paek et al. | 342/368 |
| 2003/0011518 A1 | 1/2003 | Sievenpiper et al. | |
| 2005/0133080 A1 * | 6/2005 | Jeong et al. | 136/244 |
| 2007/0034247 A1 | 2/2007 | Takada | |
| 2012/0204955 A1 * | 8/2012 | Apostolos et al. | 136/259 |

OTHER PUBLICATIONS

S. Vaccaro, P. Torres, J.R. Mosig, A. Shah, J.F. Zurcher, A.K. Skrivervik, F. Gardiol, P.De Maagt, and L. Gerlach, Integrated solar panel antennas, Electronics Letters, Mar. 2, 2000, pp. 390-391, vol. 36 No. 5, Institution of Electrical Engineers; Institution of Engineering and Technology, Institution of Electrical Engineers (IEE).
M.J. Roo Ons, S.V. Shynu, Max Ammann, S. McCormack, and Brian Norton, Investigation on proximity-coupled microstrip integrated PV antenna, Dublin Institute of Technology, Conference Papers, 2007, available at http://arrow.dit.ie/engschececon/30.
S.V. Shynu, Maria J. Roos Ons, Max Ammann, Sarah Gallagher, and Brian Norton, Inset-fed microstrip patch antenna with integrated polycrystalline photovoltaic solar cell, Dublin Institute of Technology, Conference Papers, 2007 available at http://arrow.dit.ie/engschececon/32.
C. Bendel, J. Kirchhof, and N. Henze, Application of photovoltaic solar cells in planar antenna structures, 3rd World Conference on Photovoltaic Energy, Osaka Japan, May 11-18, 2003, University of Kassel, Kassel, Germany.

(Continued)

*Primary Examiner* — Tan Ho
(74) *Attorney, Agent, or Firm* — Egbert Law Offices, PLLC

(57) ABSTRACT

A photovoltaic apparatus, through which an antenna is allowed to transmit and receive radio-frequency signals, includes a photovoltaic material and conducting electrodes. The photovoltaic material is used for converting photon energy into electrical energy, and the conducting electrodes collect and transfer the electrical energy generated by the photovoltaic material. The arrangement of the conducting electrodes forms a frequency selective surface placed in the transmitting or receiving path of the antenna. The frequency selective surface and the antenna have a spacing there between. The projection of the frequency selective surface in the transmitting or receiving path of the antenna covers the antenna.

16 Claims, 10 Drawing Sheets

OTHER PUBLICATIONS

Shynu S.V., Maria J. Roo Ons, Max J. Ammann, Sarah McCormack, and Brian Norton, A Metal Plate Solar Antenna for UMTS PICO-Cell Base Station, 2008 Loughborough Antennas & Propogation Conference, Mar. 17-18, 2008, School of Electronic and Communications Engineering, Dublin Institute of Technology, Dublin, Ireland.

Shynu S.V., Maria J. Roos Ons, Giuseppe Ruvio, Max J. Ammann, Sarah McCormack, and Brian Norton, A Microstrip Printed Dipole Solar Antenna using Polycrystalline Silicon Solar Cells, Antennas and Propagation Society International Symposium, 2008. AP-S 2008. IEEE, Jul. 5-11, 2008, pp. 1-4, San Diego, California.

Norbert Henze, Andre Giere, and Henning Fruchting, GPS Patch Antenna with Photovoltaic Solar Cells for Vehicular Applications, Vehicular Technology Conference, 2003. VTC 2003-Fall. 2003 IEEE 58th, Oct. 5-9, 2003, pp. 50-54, vol. 1, University of Kassel, Kassel, Germany.

J. Kuendig, M. Goetz, X. Niquille, A. Shah, S. Vaccaro, J. Mosig, L. Gerlach, P. De Maagt, E. Fernandez, Thin-Film Silicon Solar Cells for Space Applications: Radiation Hardness and Applications for an Integrated Solant (Solar Cell-Antenna) Module, Photovoltaic Specialists Conference, Sep. 2000 IEEE 28th, pp. 1079-1082, Anchorage Alaska.

Robert M. Manning, An Overview of Antenna R&D Efforts in Support of NASA's Space Exploration Vision, IDGA's Military Antenna Systems Conference, Sep. 26-28, 2007.

Dr. C. Bendel, J. Korchhof, N. Henze, Solar Cell Antennas in Wireless Communication and Radio Broadcast Systems, 19th European Photovoltaic Solar Energy Conference and Exhibition, Jun. 7-11, 2004, Paris, France, pp. 1-4.

Office Action issued May 14, 2012 by Chinese Patent Office for Chinese counterpart application.

English translation of Office Action issued May 14, 2012 by Chinese Patent Office for Chinese counterpart application.

* cited by examiner

PHOTOVOLTAIC APPARATUS

CROSS-REFERENCE TO RELATED APPLICATIONS

This application claims priority from U.S. Provisional Application Ser. No. 61/231,233, filed on Aug. 4, 2009.

STATEMENT REGARDING FEDERALLY SPONSORED RESEARCH OR DEVELOPMENT

Not applicable.

NAMES OF THE PARTIES TO A JOINT RESEARCH AGREEMENT

Not applicable.

INCORPORATION-BY-REFERENCE OF MATERIALS SUBMITTED ON A COMPACT DISC

Not applicable.

BACKGROUND OF THE INVENTION

1. Field of the Invention

The disclosure relates to a photovoltaic apparatus, and more specifically, a photovoltaic apparatus allowing an antenna to transmit and receive radio-frequency (RF) signals.

2. Description of Related Art Including Information Disclosed Under 37 CFR 1.97 and 37 CFR 1.98.

Recently, the need for alternative energy sources has significantly increased. The installation of photovoltaic apparatuses has also increased significantly due to the encouragement of governments around the world. In addition to those areas outside of city centers, where the sunlight is sufficient but the population is sparse, photovoltaic apparatuses now are also installed on building roofs in urban areas, and are known as building integrated photovoltaics (BIPVs). It is foreseeable that in the near future there will be many buildings installed with photovoltaic apparatuses on the roofs or even on the walls. However, it is common for some wireless communication apparatuses, such as base stations, point-to-point relays, satellite receivers, radio antennas and TV antennas to be installed on building roofs in urban areas. Therefore, it is desirable to integrate these two apparatuses.

It is anticipated that photovoltaic apparatuses will also be installed on the walls or windows of buildings and on exterior panels or windows of cars. If there is any communication apparatus in such a building or a car, the signal strength will be affected. Moreover, mobile communication apparatuses, such as notebook computers and cellular phones, will likely be equipped with photovoltaic apparatuses. These photovoltaic apparatuses comprise a large amount of metal materials. Installing these photovoltaic apparatuses in the transmission path of the antennas of the mobile communication apparatuses will affect the functionality of these mobile communication apparatuses. Therefore, a special means or approach is required to integrate these two apparatuses and retain their functions.

BRIEF SUMMARY OF THE INVENTION

The present disclosure arranges the conductive electrodes of one or more photovoltaic apparatus to constitute a frequency selective surface (FSS) located in the transmission path of an electromagnetic wave. By adjusting the geometric parameters of each cell of the photovoltaic apparatus, the pass band and stop band of the FSS can be adjusted to meet the requirements of an RF communication system or an RF antenna.

The present disclosure discloses a photovoltaic apparatus, which includes a photovoltaic material and conducting electrodes and allows an antenna to transmit and receive RF signals. The photovoltaic material is used to convert photon energy into electrical energy, and the conducting electrodes collect and transfer the electrical energy generated by the photovoltaic material. The arrangement of the conducting electrodes forms an FSS located in the transmitting or receiving path of the antenna. The FSS and the antenna have a spacing there between. The projection of the FSS in the transmitting or receiving path of the antenna covers the antenna.

Moreover, the aforementioned photovoltaic apparatus can be used as photovoltaic apparatus cells. According to the present disclosure, a plurality of photovoltaic apparatus cells can be combined into modules. The plurality of photovoltaic apparatus cells can be rearranged, and the spacing between the photovoltaic apparatus cells or modules can be adjusted to implement the required FFS.

BRIEF DESCRIPTION OF THE SEVERAL VIEWS OF THE DRAWINGS

The accompanying drawings, which are incorporated in and constitute a part of this specification, show embodiments of the disclosure and, together with the description, serve to explain the principles of the disclosure.

DETAILED DESCRIPTION OF THE INVENTION

Figure 1:
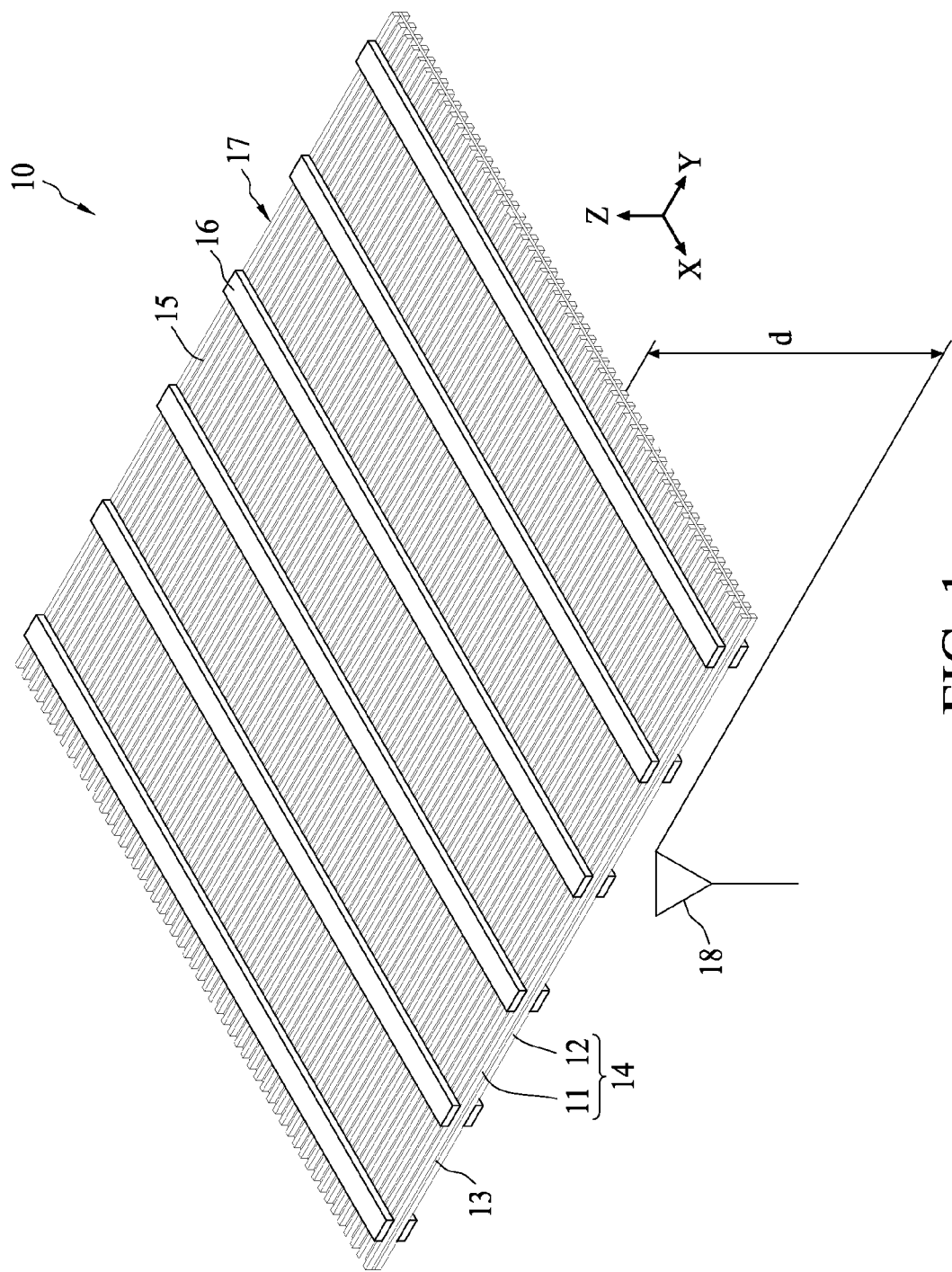
FIG. 1 shows a schematic view of a photovoltaic apparatus in accordance with an exemplary embodiment.

The following exemplary embodiments of photovoltaic apparatuses are for explanation purpose only, and do not represent the restrictions of the disclosure.

A common photovoltaic apparatus cell is generally composed with the following elements: a transparent front cover (usually glass), a front electrode, a back electrode, an inter-cell connecting electrode, a photovoltaic material and a back cover or bearing structure. A photovoltaic apparatus module comprises a plurality of photovoltaic apparatus cells connected in parallel or in serial to provide required output voltage and output current.

In a large photovoltaic apparatus with monocrystalline or polycrystalline photovoltaic material, usually a full wafer is used as a photovoltaic apparatus cell. However, in a small photovoltaic apparatus, usually a partial wafer is used as a photovoltaic apparatus cell due to the space limitation and the output voltage requirement (multiple photovoltaic apparatus cells are required to be connected in serial to provide higher output voltage). Such wafer cutting requires additional time and costs. Assembling smaller cells into a module is also time-consuming. Therefore, practically speaking, a large photovoltaic apparatus cell, preferably a full wafer, is more efficient as long as the system requirements are met.

A common photovoltaic apparatus cell with crystalline photovoltaic material often uses orthogonal grid front electrodes, which comprise finger electrodes spaced at equal intervals covering the cell, and thicker and fewer bus-bar electrodes connecting the finger electrodes. Serial electrical connection is achieved by the usage of connecting electrodes, which conduct the current of the bus-bar electrodes to the electrodes of nearby cells. An opaque metal is often used in a common crystalline photovoltaic apparatus cell (a thin film photovoltaic apparatus cell, in contrast, often uses transparent conductive oxide (TCO), which is less conductive). If too many electrodes are used, the interval between each electrode will be narrower, most of the area will be covered, the effective illuminated area will be reduced, and the output power will be less. If the interval between each electrode is too wide (compared with the average free path of the electron-hole pair of the photovoltaic material), the distance for the electrons and holes to travel to the electrodes will be farther. Accordingly, the probability of the recombination of the electrons and holes will increase, and the photovoltaic efficiency will decrease. Typically, the interval between the finger electrodes of an ordinary poly-silicon photovoltaic apparatus cell ranges from two to four millimeters. A photovoltaic apparatus cell of six inches square usually contains three bus-bar electrodes. Since the back electrode is not required to block the light, the back electrode is often implemented in the manner of covering the back of the photovoltaic apparatus cell with metal material.

The present disclosure uses photovoltaic apparatus cells as periodic cells of frequency selective surface (FSS), which are placed in the transmission path of an RF electromagnetic wave. By adjusting the geometric parameters of the cells, the pass band and stop band of the FSS can be controlled to meet the requirements of an RF communication system or the RF antenna. In a plane wave penetration test, it is discovered that by adjusting the periodic interval of the electrodes in the cells, the pass band and stop band of the FSS can be adjusted as well.

Exemplary Embodiment 1

FIG. 1 shows a photovoltaic apparatus 10, which allows an antenna to transmit and receive radio-frequency signals, in accordance with Exemplary Embodiment 1. The photovoltaic apparatus 10 comprises front electrodes 11, back electrodes 12 and a photovoltaic material 13. The front electrodes 11 and the back electrodes 12 are placed on both sides of the photovoltaic material 13 respectively. A plurality of bus-bar electrodes 16 and the finger electrodes 15 constituted by the front electrodes 11 and the back electrodes 12 form orthogonal grids and collect the current from the front electrodes 11 and the back electrodes 12. The photovoltaic material 13 is capable of converting photon energy into electrical energy. The front electrodes 11 and the back electrodes constitute conducting electrodes 14, which are configured to collect and transfer the electrical energy generated by the photovoltaic material 13 to another photovoltaic apparatus, a power system or a power storage apparatus. The photovoltaic material 13 can be silicon semiconductor, e.g. single crystal silicon, poly-silicon, amorphous silicon thin film and poly-silicon thin film; III-V compounds, e.g. GaAs, AlGaAs, InGaP, InGaAs and InP; II-VI or I-III-VI compounds, e.g. CdTe, CuInSe2 (CIS), CuGaInSe2 (CGIS) and $CuIn_{1-x}Ga_xS_{1-y}Se_y$ (CIGSS); an organic indigo or a composite structure with multi-junction.

The arrangement of the conducting electrodes 14 forms an FSS 17. In this exemplary embodiment, the front electrodes 11 and the back electrodes constitute the FSS 17. The FSS 17 is located in the transmitting or receiving path of an antenna 18. There is a distance d between the FSS 17 and the antenna 18. The distance d could be arbitrary value but should be large enough (generally larger than $1/2\pi$ times the wavelength ($\lambda/2\pi$ or $0.159\lambda$)) such that the FSS 17 is outside the reactive near field region of the antenna 18, otherwise the interaction between the FSS 17 and the antenna 18 needs to be taken into account. This interaction would change the frequency response of the FSS 17 and/or the antenna 18. The projection of the FSS 17 in the main transmitting or receiving path of the antenna 18 covers the antenna 18.

Figure 2:
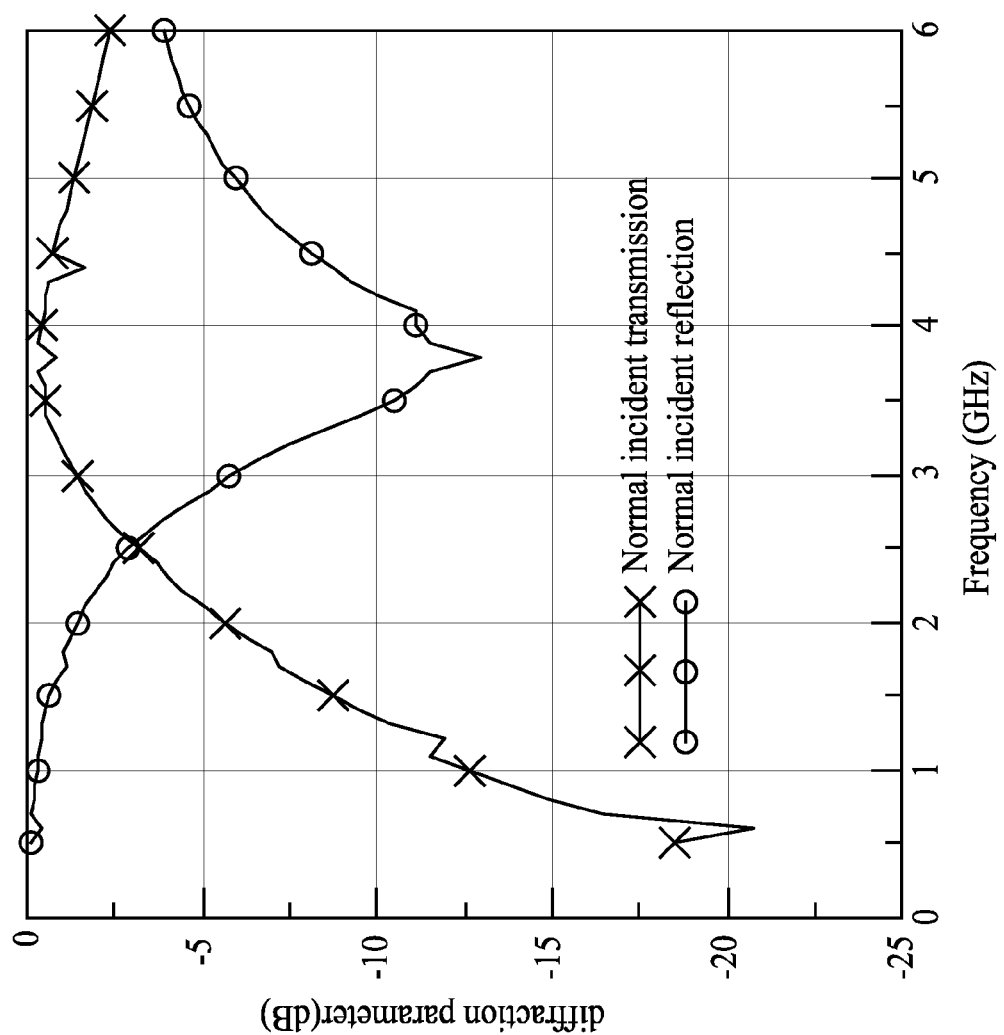
FIGS. 2 and 3 show graphical views of transmission rate versus frequency of the photovoltaic apparatus shown in FIG. 1.

Specifically, the photovoltaic apparatus 10 is composed of a square poly-silicon wafer with thickness of 0.35 millimeter and side length of 150 millimeters (about six inches). The front electrodes and the back electrodes are arranged to form a grid-like formation, comprising the finger electrodes 15 spaced at equal intervals covering the photovoltaic apparatus 10, and the thicker and fewer bus-bar electrodes 16 connecting the finger electrodes 15. A glass material, which has less effect on the transmitted electromagnetic wave than other materials, is used for the bearing structure. The interval between each finger electrode 15 is 2.8 millimeters. If the microwave signal of an RF communication system to be integrated is linearly polarized, the microwave signal propagates along the z direction as shown in FIG. 1, and the polarization direction is along the x direction. By adjusting the number of and the interval between the bus-bar electrodes 16, the through band of the RF electromagnetic wave can be adjusted as well. Generally, fewer and more broadly-spaced bus-bar electrodes 16 correspond to an RF electromagnetic wave with lower pass band, and vice versa. If material loss is not considered, a photovoltaic apparatus with six bus-bar electrodes 16 spaced in 25-millimeter intervals has an RF electromagnetic wave with pass band covering C-band (3.4 GHz-4.2 GHz), which is mainly for satellite communication, as shown in FIG. 2. By using the photovoltaic apparatus module composed of these kinds of photovoltaic apparatuses with pass band covering C-band, the interference of the photovoltaic apparatus 10 on the electromagnetic wave is reduced. In this embodiment, even though the number of the bus-bar electrodes 16 is greater than that of an ordinary photovoltaic apparatus, by reducing the electrode width and reducing the covered area, the negative effect upon the output power of the photovoltaic apparatus 10 is minimized.

One of the formations of the aforementioned grid-like formation is orthogonal grid.

Figure 3:
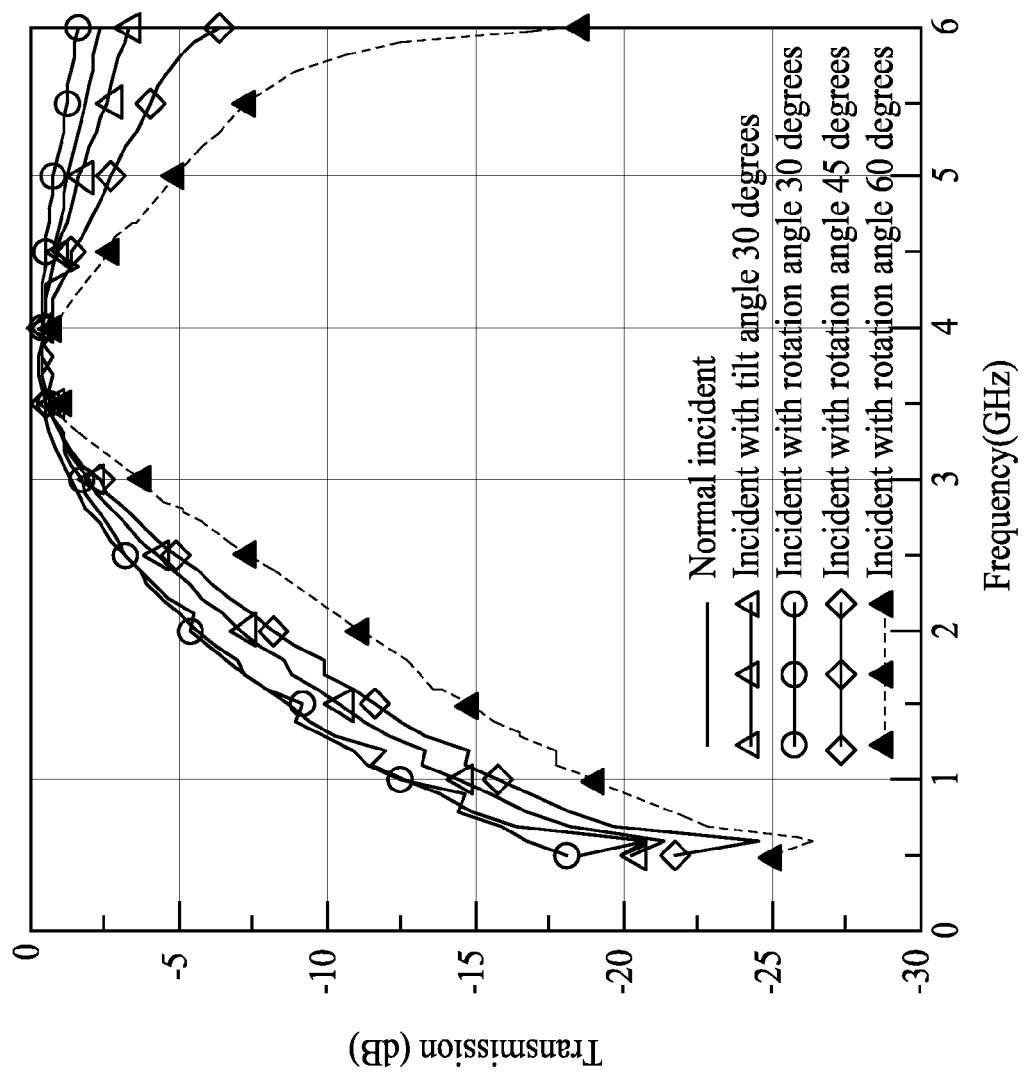

FIG. 3 shows a graph of transmission rate versus frequency of the electromagnetic wave for different incident angles according to this embodiment. As shown in FIG. 3, the change of the incident angles has little effect on the transmission rate in the operation frequency. In this embodiment, the angle between the photovoltaic apparatus and the ground is based on the latitude of the location at which the photovoltaic apparatus is installed. The angle is then adjusted (plus or minus 15 degrees) according to the season. That is, the surface of the photovoltaic apparatus 10 facing the sunlight roughly points to the equatorial plane. The angle is about the same as the elevation angle of the satellite communication apparatus to a synchronous satellite. As can be seen from FIG. 3, with the angle rotated 60 degrees in a horizontal direction, the transmission rate of the RF electromagnetic wave is still acceptable. The photovoltaic apparatus 10 configured based on this embodiment have a wide-band feature and can receive RF electromagnetic waves with high incident angle. Therefore, it is suitable for satellite communication and other wide-band mobile communication systems.

The aforementioned photovoltaic apparatus 10 can be used as photovoltaic apparatus cells. According to the different application, a plurality of photovoltaic apparatus cells can be arranged in the form of array, wherein each photovoltaic apparatus cell has an FSS unit such that an FSS can be formed.

Specifically, the size of each FSS unit is determined by adjusting the number and size of photovoltaic apparatus cells in the FSS unit. Each FSS unit has spacing between adjacent FSS units, and the spacing corresponds to penetration/reflection characteristics of RF electromagnetic waves of the FSS unit. The FSS features a function of filtering RF electromagnetic waves such that an RF electromagnetic wave undergoes a specific degradation or reflection when passing the FSS.

Exemplary Embodiment 2

The constitution of the photovoltaic apparatus cell in this embodiment is similar to that of Exemplary Embodiment 1 except that the orthogonal grid back electrode is replaced with an entire surface of metal. Accordingly, the FSS unit exhibits a significantly wide stop band of the electromagnetic wave, and the pass band of the electromagnetic wave is relatively narrow. The frequency of the pass band of the electromagnetic wave can be adjusted by adjusting the size of the photovoltaic apparatus cell. A photovoltaic apparatus cell of larger size exhibits lower frequency of the pass band of the electromagnetic wave, and vice versa. The bandwidth of the pass band of the electromagnetic wave can be adjusted by adjusting the interval between each cell. Generally, a wider interval corresponds to a wider bandwidth of the pass band of the electromagnetic wave. A photovoltaic apparatus cell with square shape, equal intervals with the adjacent cells in x and y directions, and connecting electrodes in x and y directions (such that the electromagnetic waves polarized in x and y direction have the same pass band) can be used in dual polarization or circular polarization RF communication applications with relatively narrow band, such as a GPS signal receiver or transmitter.

Exemplary Embodiment 3

Figure 4:
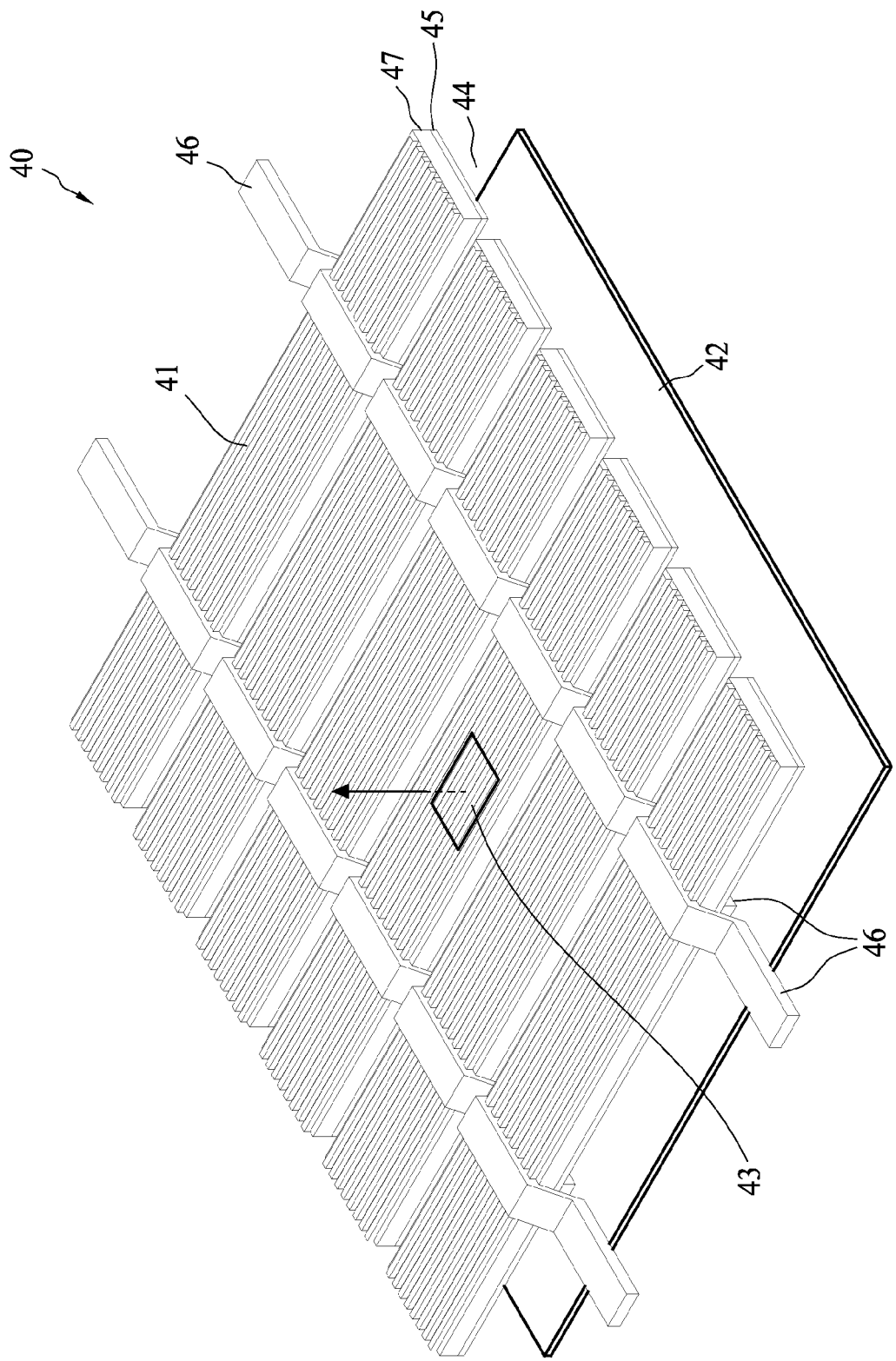
FIG. 4 shows a schematic view of a photovoltaic apparatus in accordance with another exemplary embodiment.

As shown in FIG. 4, the photovoltaic apparatus cell shown in this embodiment is similar to that shown in Exemplary Embodiment 2. In this embodiment, the photovoltaic apparatus 40 is composed of a plurality of photovoltaic apparatus cells. The front electrodes are grid electrodes 41, connected by bus bar electrodes 46. The back electrodes are implemented by covering the other side of a photovoltaic material of each cell.

Figure 5:
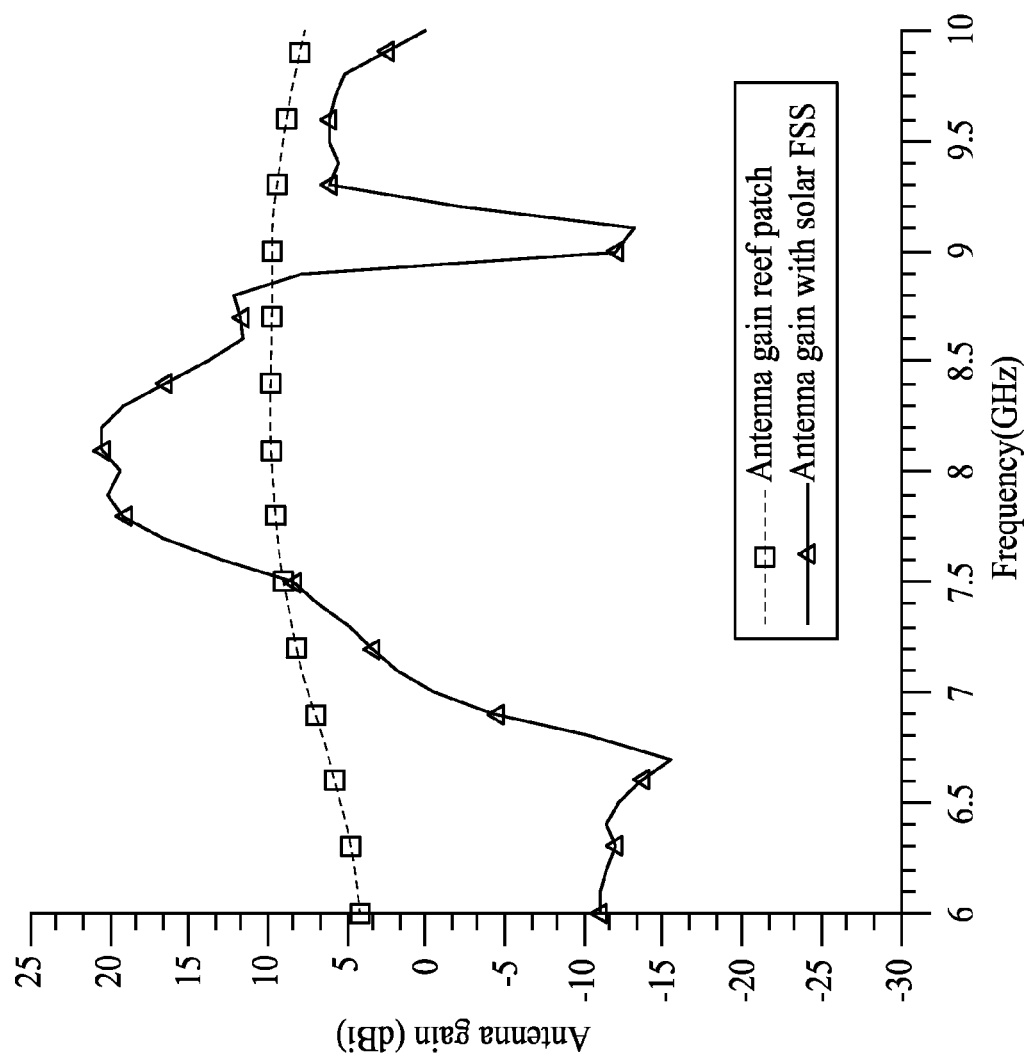
FIG. 5 shows a graphical view of antenna gain versus frequency of the photovoltaic apparatus shown in FIG. 4.

Since the FSS unit has a wide stop band, the percentage of the penetrating electromagnetic waves is lower. Accordingly, the FSS unit can be configured as a partial-penetration-layer (electrode) 41 of a Fabry-Perot (FP) resonant cavity 44, and can be combined with one or more RF excitation sources 43 and an additional reflective layer 42 parallel to the partial-penetration-layer 41 to constitute a resonant-cavity-type high-gain antenna. The penetration percentage of the FP partial-penetration-layer 41 can be adjusted by adjusting the interval between each photovoltaic apparatus cell. A higher ratio of the interval to the period of the orthogonal grid corresponds to a higher percentage of the penetrating electromagnetic waves, and vice versa. The FP partial-penetration-layer 41 formed by the FSS unit and the reflective metal layer 42 constitute the FP resonant cavity 44. The interval between the FSS unit and the reflective metal layer 44 can be configured to be one half of the wavelength of the electromagnetic waves in the pass band. By constructing a particular periodic structure, e.g. an artificial magnetic conductor (AMC), on the reflective metal layer 42, the reflective phase can be altered, and the interval between the FSS unit and the reflective metal layer 42 can be reduced. By placing a plurality of RF antennas 43 in the FP resonant cavity 44 as excitation sources, a high directionality can be achieved. Compared with an antenna without an FP partial-penetration-layer, the gain of the FP resonant cavity 44 can be enhanced as well (without considering the material loss, as shown in FIG. 5, the antenna gain increases from 10 dBi to 20 dBi). Under the circumstance of having many excitation sources, by adjusting the relative transmitting/receiving intensities and phases of each RF antenna, the RF signals can be transmitted/received obliquely, and the problem of mismatch between the propagation direction of the RF electromagnetic waves and the planar normal direction of the photovoltaic apparatus cell or the FSS unit can be solved.

Exemplary Embodiment 4

Figure 6:
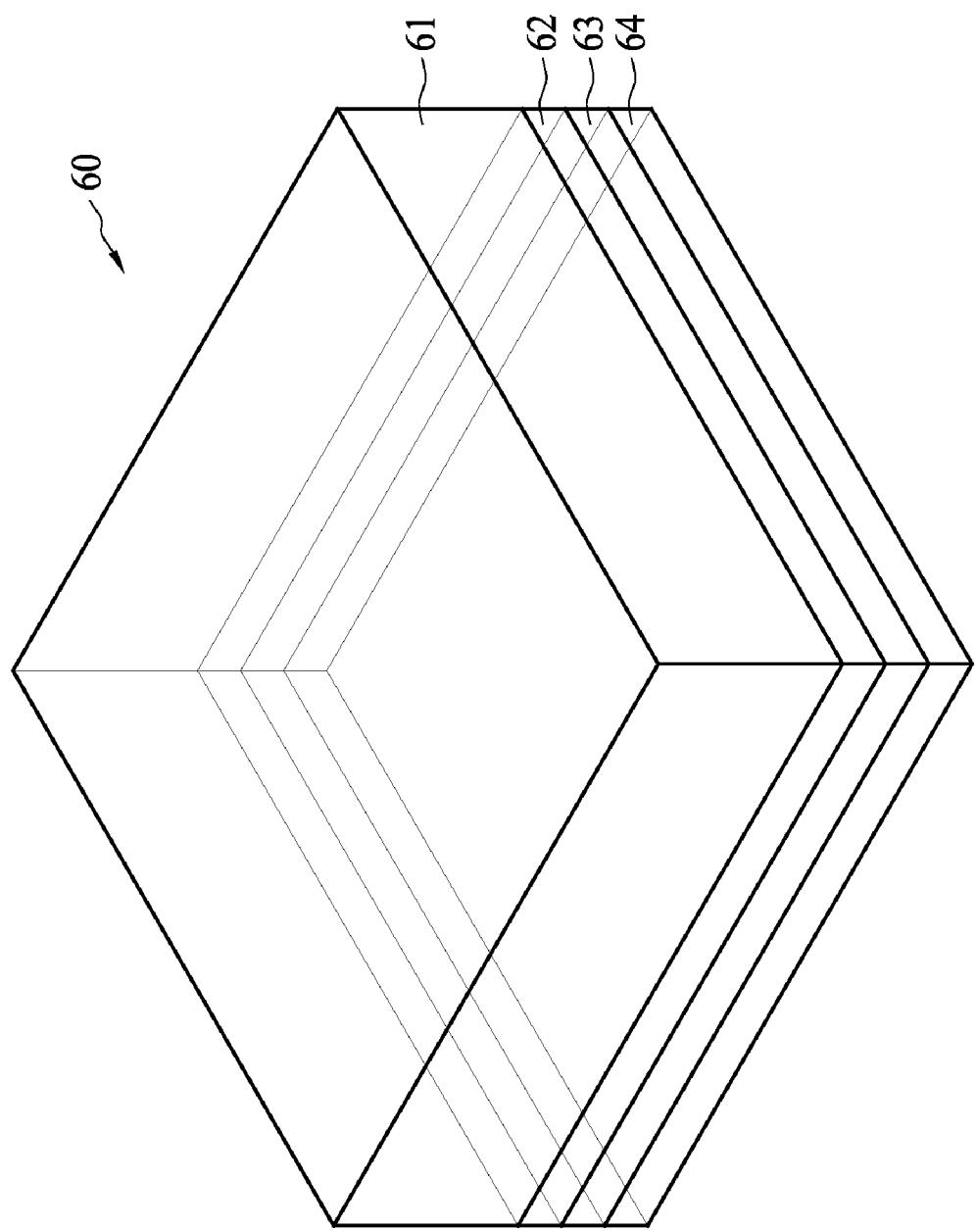
FIGS. 6 and 7 show schematic views of a photovoltaic apparatus in accordance with another exemplary embodiment.

As shown in FIG. 6, the thin-film photovoltaic apparatus cell 60 comprises a bearing structure 61 (e.g. a piece of glass), a transparent light-facing electrode 62 (usually composed of TCO), a thin-film photovoltaic material 63 (e.g. an amorphous silicon multi-layer structure) and back metal electrodes 64.

Taking the amorphous thin-film photovoltaic apparatus cell 60 for example, since the average free path of the electron-hole pair is short, a large area of electrodes is required to collect the charges effectively. In addition, due to the poor conductivity of TCO, wider wires are required to conduct the current and prevent significant ohmic loss. The back metal electrodes 64 act as a reflective layer, reflecting unabsorbed photons to the photovoltaic material. The transparent light-facing electrode 62, the thin-film photovoltaic material 63 and the back metal electrodes 64 form a capacitor-like sandwich structure, which is a relatively narrow-band band-pass structure for RF electromagnetic waves. The penetrating RF electromagnetic waves will suffer significant loss unless a specific change to the structure is introduced.

Usually, the period of the amorphous silicon thin-film photovoltaic apparatus cell 60 is short (such as six to ten millimeters). The interval between each unit is also small (such as less than one millimeter). Accordingly, the electrodes cover a large area, and it is difficult to redistribute the pass band and stop band of FSS electromagnetic waves by adjusting the cell structure.

Figure 7:
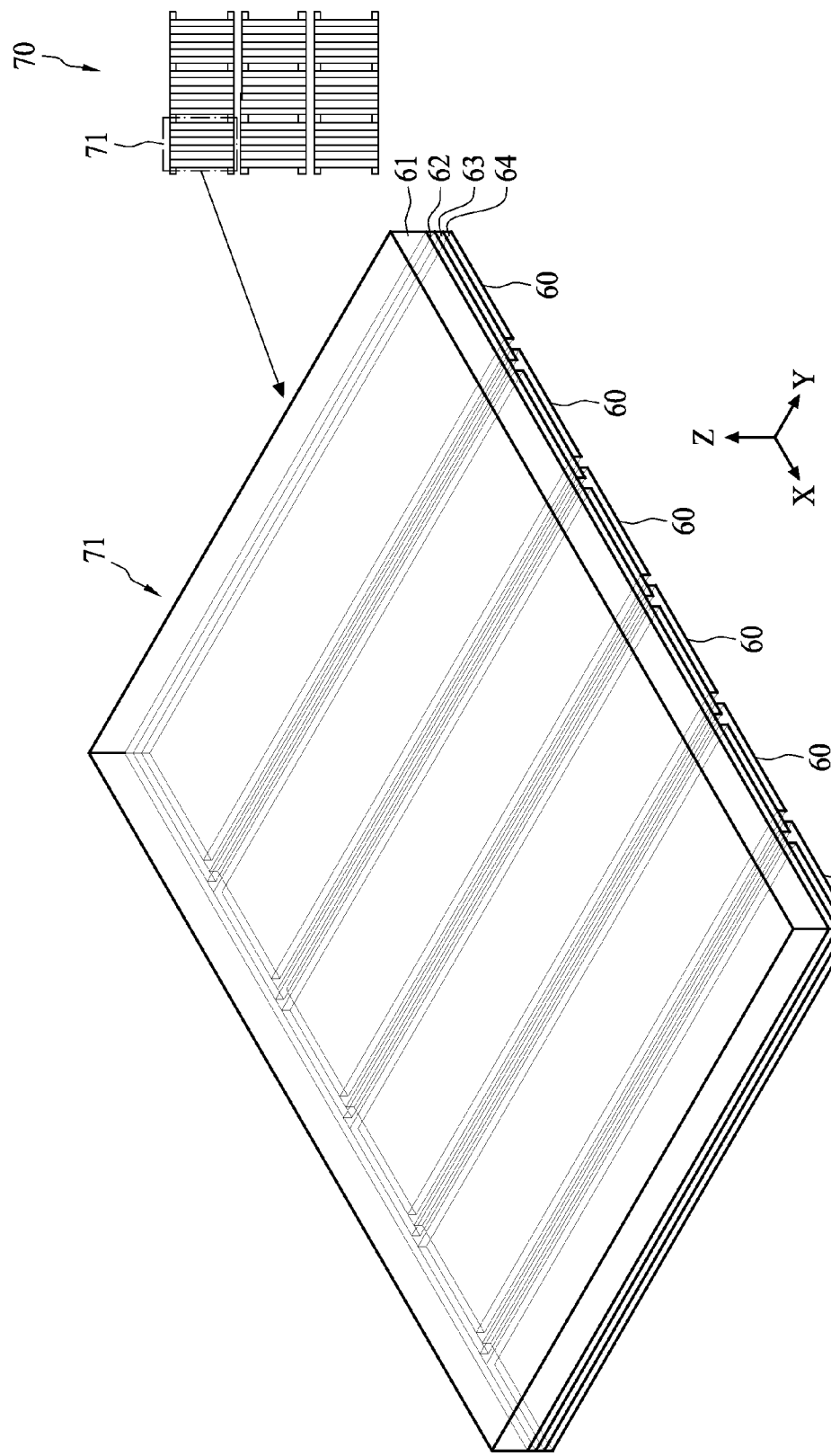

As shown in FIG. 7, in the present disclosure, a photovoltaic module 71 comprising a plurality of photovoltaic apparatus cells 60 is provided. A photovoltaic apparatus 70 is also provided by combining a plurality of photovoltaic modules 71. The back metal electrodes 64 serve as routing layer, connecting to the transparent light-facing electrode 62 of the adjacent photovoltaic apparatus cells 60. A photovoltaic module 70 based FSS unit can be configured and adjusted more freely. The size of the FSS unit can be adjusted by adjusting the sizes and numbers of the photovoltaic apparatus cells 60, and the distribution of the pass band and stop band of the RF electromagnetic waves can be adjusted accordingly. A greater interval between each photovoltaic module 71, although losing some output power, will enhance the transmission rate of the FSS unit and achieve the same integration effect as that achieved in Exemplary Embodiments 2 and 3. A plurality of the photovoltaic apparatus cells 60 can be electrically connected in serial or parallel to meet applications of dual-polarized antennas.

Exemplary Embodiment 5

In addition to transmitting and receiving RF signals, an antenna can also be used to receive electromagnetic wave energy. Combined with rectifier components, an antenna can convert electromagnetic waves into DC voltage. For example, a satellite can convert solar energy into microwave energy, which is then transmitted to an unmanned aerial vehicle (UAV) via a radio propagation path. If the UAV is covered with photovoltaic apparatus, which is combined with a microwave receiving antenna according to the aforementioned exemplary embodiments, two complementary energy-providing paths can be achieved to prolong the supply time of the UAV. In contrast, current silicon-based photovoltaic apparatus mainly absorb lights ranging from visible light to near infrared. A portion of the solar energy arriving at the earth is converted to electromagnetic waves of THz (~10 micrometers in wavelength) frequencies by non-plastic diffraction or the process of receiving and retransmission by organisms. Normally, this portion of solar energy is lost.

Figure 8:
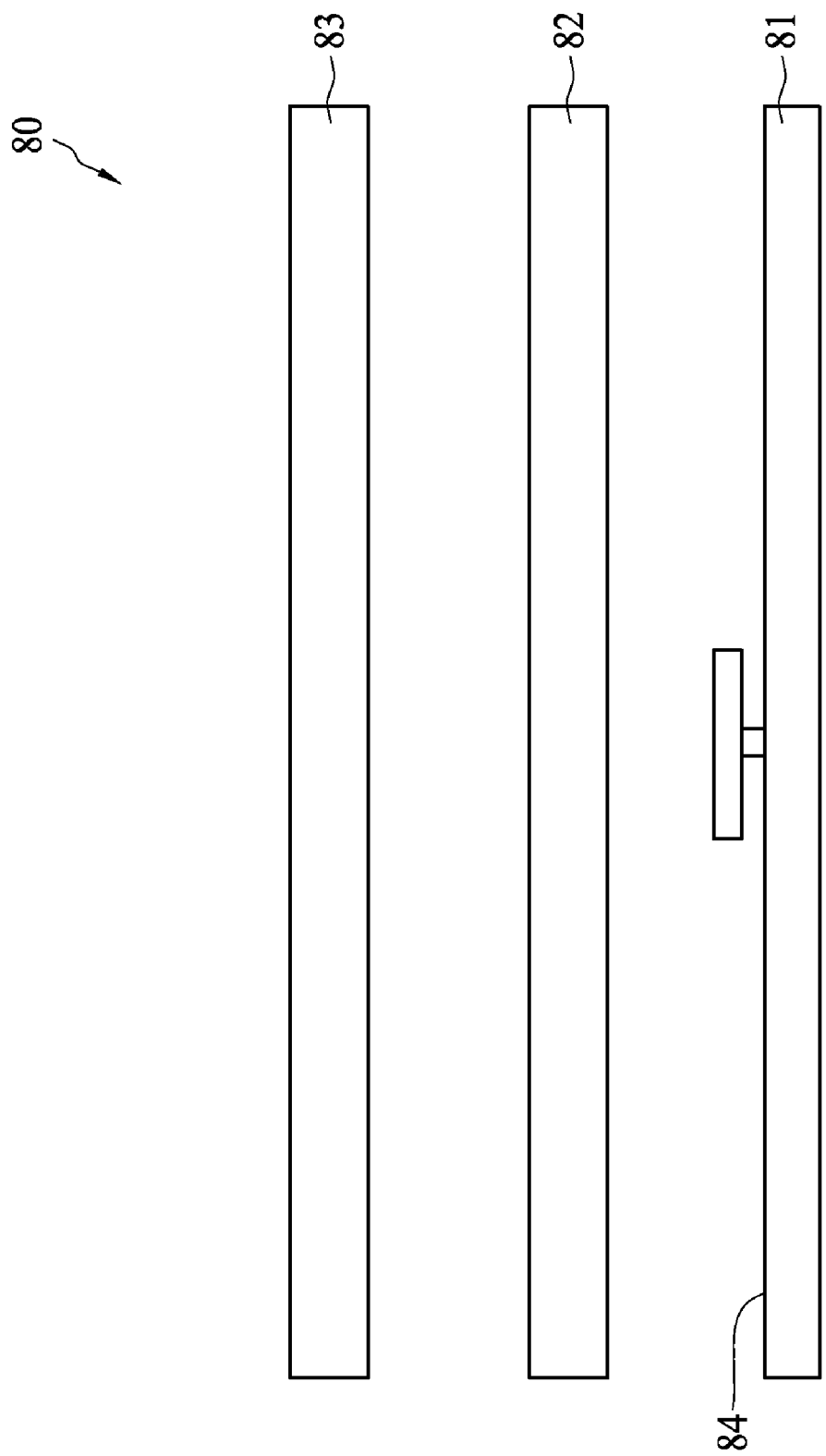
FIGS. 8 to 11 show schematic views of applications of the photovoltaic apparatuses in accordance with the present disclosure.

As shown in FIG. 8, a photovoltaic apparatus 80 comprises an antenna 80 (including a reflective surface 84), a rectifier component 82 and a photovoltaic component 83. The rectifier component 82 has an FSS allowing electromagnetic waves of GHz frequencies to pass through, and can convert electromagnetic wave energy to DC power. The photovoltaic component 83 has an FSS allowing electromagnetic waves of GHz and THz frequencies to pass through for the transmission and reception of signals. The photovoltaic component 83 can be in one of the forms according to Exemplary Embodiments 1 to 4. If an antenna 81 combined with the rectifier component 82, which then can convert high-frequency electromagnetic waves of THz frequency into DC voltage, is integrated with the photovoltaic component 83 according to the aforementioned exemplary embodiments, a two-band (light frequency and THz frequency) solar energy absorption mechanism can be achieved. Accordingly, solar energy can be extracted more effectively, and the function of RF electromagnetic wave communication can be integrated as well. Specifically, the frequency of the electromagnetic waves comprises microwave frequency, millimeter wave frequency and THz frequency.

Exemplary Embodiment 6

Figure 9:
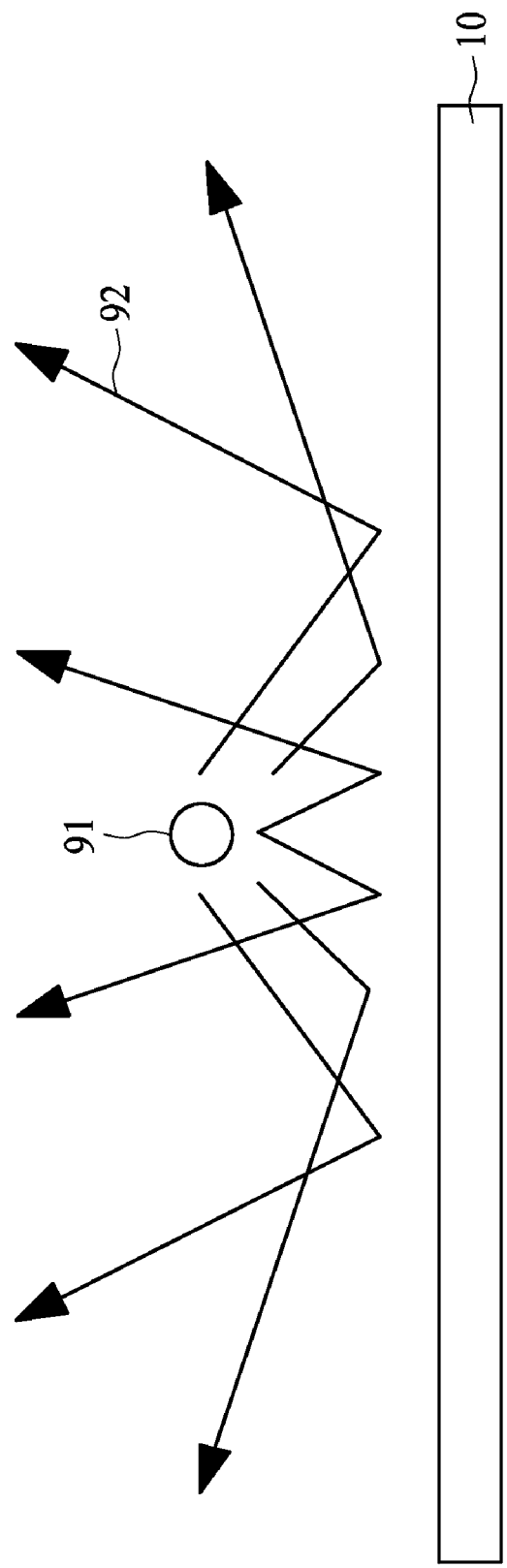

As shown in FIG. 9, the embodiment uses photovoltaic apparatus cells as an FSS unit (the photovoltaic apparatus cells according to other embodiments can also serve as an FSS), which acts as a reflection structure to reflect RF electromagnetic waves in the stop band and change the propagation direction of the RF electromagnetic waves radiated from an RF antenna 91 accordingly.

Figure 11:
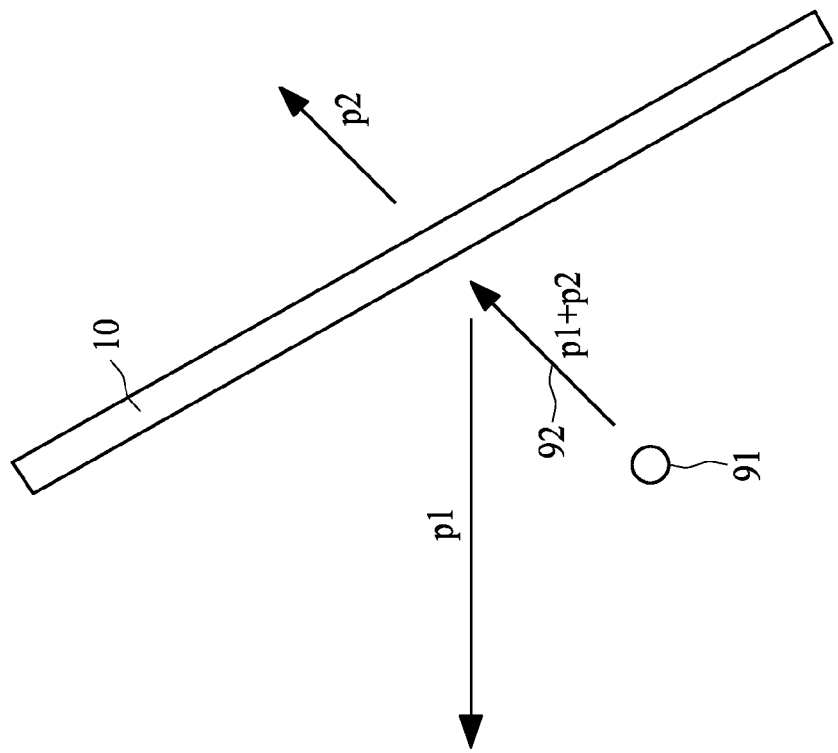
Figure 10:
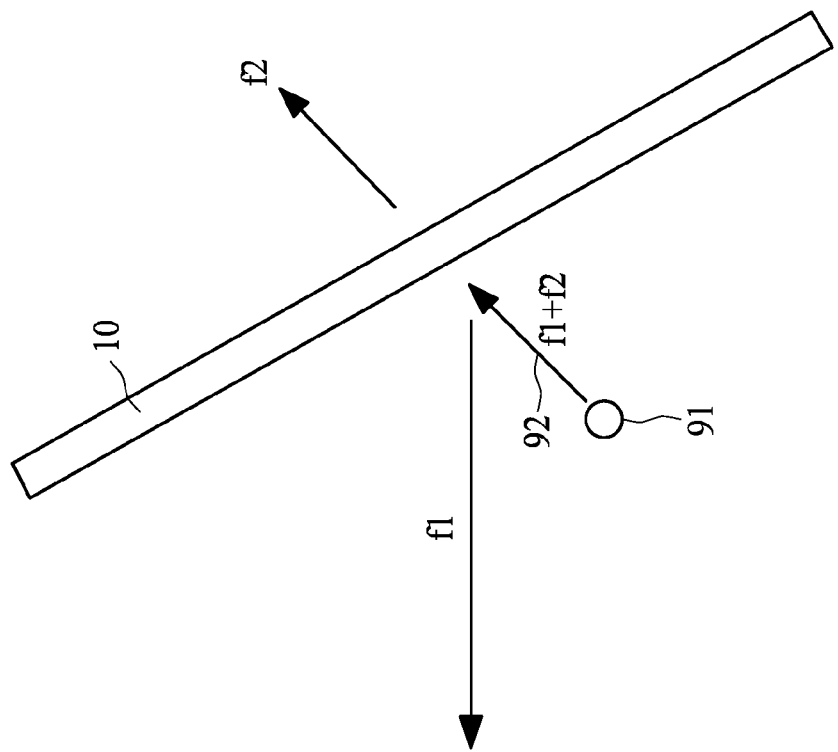

As shown in FIG. 10, electromagnetic waves 92 radiated from the RF antenna 91 with different frequencies f1 and f2 (pass band and stop band) propagate in different directions. As shown in FIG. 11, the FSS have different through/reflection characteristics for different dual-polarized RF electromagnetic waves p1 and p2. Therefore, using this feature, the photovoltaic apparatus 10 can be used as an FSS to guide differently polarized RF electromagnetic waves to different directions.

The above-described exemplary embodiments are intended to be illustrative only. Those skilled in the art may devise numerous alternative embodiments without departing from the scope of the following claims.

We claim:

1. A photovoltaic apparatus, allowing an antenna to transmit and receive radio-frequency signals, the photovoltaic apparatus comprising:

a photovoltaic material configured to convert photon energy into electrical energy; and a plurality of conducting electrodes configured to collect and transfer the electrical energy generated by the photovoltaic material;

wherein the arrangement of the conducting electrodes forms a frequency selective surface (FSS) located in the transmitting or receiving path of the antenna, the FSS and the antenna have a spacing there between, and the projection of the FSS in the main transmitting or receiving path of the antenna covers the antenna.

2. The photovoltaic apparatus of claim 1, wherein the conducting electrodes comprises:

a front electrode, located on one side of the photovoltaic material; and a back electrode, located on the another side of the photovoltaic material;

wherein the front electrode and the back electrode are configured in an orthogonal grid manner such that the FSS has a wide pass band, and the antenna is capable of transmitting and receiving wide-band electromagnetic wave signals.

3. The photovoltaic apparatus of claim 1, wherein the arrangement of the conducting electrodes forms a partial penetrable FSS, which has spacing between a reflective surface parallel to the FSS, and the combination of the FSS and the reflective surface forms a Fabry-Perot resonant cavity.

4. The photovoltaic apparatus of claim 3, wherein the reflective surface has periodic structure such that the spacing of the Fabry-Perot resonant cavity is less than one half of the wavelength.

5. The photovoltaic apparatus of claim 3, wherein the antenna is located in the Fabry-Perot resonant cavity.

6. The photovoltaic apparatus of claim 1, wherein the FSS features dual polarization.

7. The photovoltaic apparatus of claim 1, wherein the photovoltaic material is a silicon semiconductor, III-V compounds, II-VI compounds, I-III-VI compounds, an organic indigo, or a combination thereof.

8. The photovoltaic apparatus of claim 1, which further comprises a rectifier component to convert the energy of the electromagnetic waves received by the antenna into direct current (DC) electricity energy and output the electricity energy DC to a power system or a power storage apparatus.

9. The photovoltaic apparatus of claim 8, wherein the frequency of the electromagnetic waves are microwave frequency, millimeter wave frequency or THz frequency.

10. A photovoltaic apparatus, allowing an antenna to transmit and receive radio-frequency signals, the photovoltaic apparatus comprising:

a plurality of photovoltaic apparatus cells, comprising a photovoltaic material and a plurality of conducting electrodes;

the arrangement of the plurality of photovoltaic apparatus cells forms an array, which is a frequency selective surface (FSS) located in the transmitting or receiving path of the antenna, the FSS and the antenna have a spacing there between, the projection of the FSS in the main transmitting or receiving path of the antenna covers the antenna, and the shortest distance between the antenna and the FSS can reduce FSS-to-antenna interaction.

11. The photovoltaic apparatus of claim 10, wherein the array is composed of a plurality of photovoltaic modules, each photovoltaic module comprises a plurality of photovoltaic apparatus cells, and each photovoltaic apparatus cell has an FSS unit.

12. The photovoltaic apparatus of claim 11, wherein the size of each FSS unit is determined by adjusting the number and size of photovoltaic apparatus cells in the FSS unit, each FSS unit has spacing between adjacent FSS units, and the spacing corresponds to penetration/reflection characteristics of RF electromagnetic waves of the FSS unit.

13. The photovoltaic apparatus of claim 10, wherein the FSS features a function of filtering RF electromagnetic waves such that an RF electromagnetic wave undergoes a specific degradation or reflection when passing the FSS.

14. The photovoltaic apparatus of claim 10, wherein the plurality of the photovoltaic apparatus cells are thin-film photovoltaic apparatus cells.

15. The photovoltaic apparatus of claim 10, wherein the plurality of the photovoltaic apparatus cells are electrically connected in serial or parallel to meet applications of dual-polarized antennas.

16. The photovoltaic apparatus of claim 10, wherein the shortest distance between the antenna and the FSS is greater than 0.159 times the wavelength of operation frequency of the antenna.

* * * * *